US012683122B2

(12) United States Patent (10) Patent No.: US 12,683,122 B2
Matsuhashi et al. (45) Date of Patent: Jul. 14, 2026

(54) ETCHING METHOD AND PLASMA PROCESSING APPARATUS

(71) Applicant: Tokyo Electron Limited, Tokyo (JP)

(72) Inventors: Taihei Matsuhashi, Kurokawa-gun (JP); Wakako Ishida, Kurokawa-gun (JP)

(73) Assignee: Tokyo Electron Limited, Tokyo (JP)

( * ) Notice: Subject to any disclaimer, the term of this patent is extended or adjusted under 35 U.S.C. 154(b) by 198 days.

(21) Appl. No.: 18/544,237

(22) Filed: Dec. 18, 2023

(65) Prior Publication Data

US 2024/0212982 A1 Jun. 27, 2024

(30) Foreign Application Priority Data

Dec. 27, 2022 (JP) ................................. 2022-209422

(51) Int. Cl.
*H10P 50/00* (2026.01)
*H01J 37/32* (2006.01)
*H10P 50/28* (2026.01)
*H10P 72/00* (2026.01)

(52) U.S. Cl.
CPC .. *H01J 37/32146* (2013.01); *H01J 37/32091* (2013.01); *H01J 37/32128* (2013.01); *H01J 37/32137* (2013.01); *H01J 37/32174* (2013.01); *H01J 37/32449* (2013.01); *H10P 50/283* (2026.01); *H10P 50/73* (2026.01);

*H10P 72/0421* (2026.01); *H01J 2237/332* (2013.01); *H01J 2237/334* (2013.01); *H01J 2237/3341* (2013.01)

(58) Field of Classification Search
None
See application file for complete search history.

(56) References Cited

U.S. PATENT DOCUMENTS

2021/0233776 A1* 7/2021 Ishida .................. H01L 21/3065
2021/0343539 A1* 11/2021 Suda .................. H01L 21/31116

FOREIGN PATENT DOCUMENTS

JP 2021-118304 A 8/2021

* cited by examiner

*Primary Examiner* — Jiong-Ping Lu
(74) *Attorney, Agent, or Firm* — Studebaker Brackett PLLC

(57) ABSTRACT

A disclosed etching method includes (a) preparing a substrate on a substrate support in a chamber. The substrate includes a multilayer film including a plurality of first films and a plurality of second films that are alternately stacked with the plurality of first films, and a mask disposed on the multilayer film. The etching method further includes (b) etching one or more first films among the plurality of first films. The etching method further includes (c) etching one or more second films among the plurality of second films. In each of the (b) and (c), a pulse of a source radio frequency power for plasma generation and a pulse of an electric bias for ion attraction are intermittently or periodically supplied.

15 Claims, 15 Drawing Sheets

ETCHING METHOD AND PLASMA PROCESSING APPARATUS

CROSS-REFERENCE TO RELATED APPLICATIONS

This application is based on and claims the benefit of priority from Japanese Patent Application No. 2022-209422 filed on Dec. 27, 2022, the entire contents of which are incorporated herein by reference.

FIELD

Exemplary embodiments of the present disclosure relate to an etching method and a plasma processing apparatus.

BACKGROUND

In plasma etching for a substrate, the film of a substrate is etched to form a shape defining a recess in the film. Japanese Unexamined Patent Publication No. 2021-118304 discloses a method of forming a step shape defining a recess by etching a multilayer film of a substrate. The multilayer film includes a plurality of silicon oxide films and a plurality of silicon nitride films that are alternately stacked with the plurality of silicon oxide films.

SUMMARY

In an exemplary embodiment, an etching method is provided. The etching method includes (a) preparing a substrate on a substrate support in a chamber of a plasma processing apparatus. The substrate includes a multilayer film including a plurality of first films formed of silicon oxide and a plurality of second films that are formed of silicon nitride and alternately stacked with the plurality of first films, and a mask disposed on the multilayer film. The multilayer film includes a first region and a second region below an opening of the mask. The second region is adjacent to the first region. Each of the first region and the second region has a step shape in a cross-section perpendicular to a direction in which the first region and the second region are arranged. A depth of a first recess defined by the first region below the opening of the mask is deeper than a depth of a second recess defined by the second region below the opening of the mask. The etching method further includes (b) etching one or more first films among the plurality of first films by generating plasma from a first process gas in the chamber. The etching method further includes (c) etching one or more second films among the plurality of second films by generating plasma from a second process gas in the chamber. In each of (b) and (c), a pulse of a source radio frequency power for generating plasma in the chamber and a pulse of an electric bias for attracting ions from the plasma in the chamber to the substrate are intermittently or periodically supplied.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
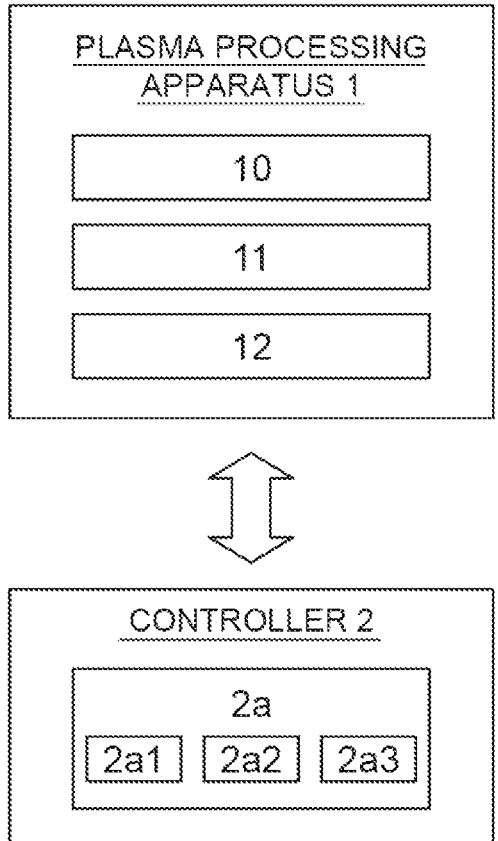
FIG. 1 illustrates an example configuration of a plasma processing system.

Hereinafter, various exemplary embodiments will be described in detail with reference to the drawings. In the drawings, the same or equivalent portions are denoted by the same reference symbols.

FIG. 1 illustrates an example configuration of a plasma processing system. In an embodiment, the plasma processing system includes a plasma processing apparatus 1 and a controller 2. The plasma processing system is an example substrate processing system, and the plasma processing apparatus 1 is an example substrate processing apparatus. The plasma processing apparatus 1 includes a plasma processing chamber 10, a substrate support 11, and a plasma generator 12. The plasma processing chamber 10 has a plasma processing space. The plasma processing chamber 10 further has at least one gas inlet for supplying at least one process gas into the plasma processing space and at least one gas outlet for exhausting gases from the plasma processing space. The gas inlet is connected to a gas supply 20 described below and the gas outlet is connected to a gas exhaust system 40 described below. The substrate support 11 is disposed in a plasma processing space and has a substrate supporting surface for supporting a substrate.

The plasma generator 12 is configured to generate a plasma from the at least one process gas supplied into the plasma processing space. The plasma formed in the plasma processing space may be, for example, a capacitively coupled plasma (CCP), an inductively coupled plasma (ICP), an electron-cyclotron-resonance (ECR) plasma, a helicon wave plasma (HWP), or a surface wave plasma (SWP). Various types of plasma generators may also be used, such as an alternating current (AC) plasma generator and a direct current (DC) plasma generator. In an embodiment, AC signal (AC power) used in the AC plasma generator has a frequency in a range of 100 kHz to 10 GHz. Hence, examples of the AC signal include a radio frequency (RF) signal and a microwave signal. In an embodiment, the RF signal has a frequency in a range of 100 kHz to 150 MHz.

The controller 2 processes computer executable instructions causing the plasma processing apparatus 1 to perform various steps described in this disclosure. The controller 2 may be configured to control individual components of the plasma processing apparatus 1 such that these components execute the various steps. In an embodiment, the functions of the controller 2 may be partially or entirely incorporated into the plasma processing apparatus 1. The controller 2 may include a processor 2a1, a storage 2a2, and a communication interface 2a3. The controller 2 is implemented in, for example, a computer 2a. The processor 2a1 may be configured to read a program from the storage 2a2, and then perform various controlling operations by executing the program. This program may be preliminarily stored in the storage 2a2 or retrieved from any medium, as appropriate. The resulting program is stored in the storage 2a2, and then the processor 2a1 reads to execute the program from the storage 2a2. The medium may be of any type which can be accessed by the computer 2a or may be a communication line connected to the communication interface 2a3. The processor 2a1 may be a central processing unit (CPU). The storage 2a2 may include a random access memory (RAM), a read only memory (ROM), a hard disk drive (HDD), a solid state drive (SSD), or any combination thereof. The communication interface 2a3 can communicate with the plasma processing apparatus 1 via a communication line, such as a local area network (LAN).

Figure 2:
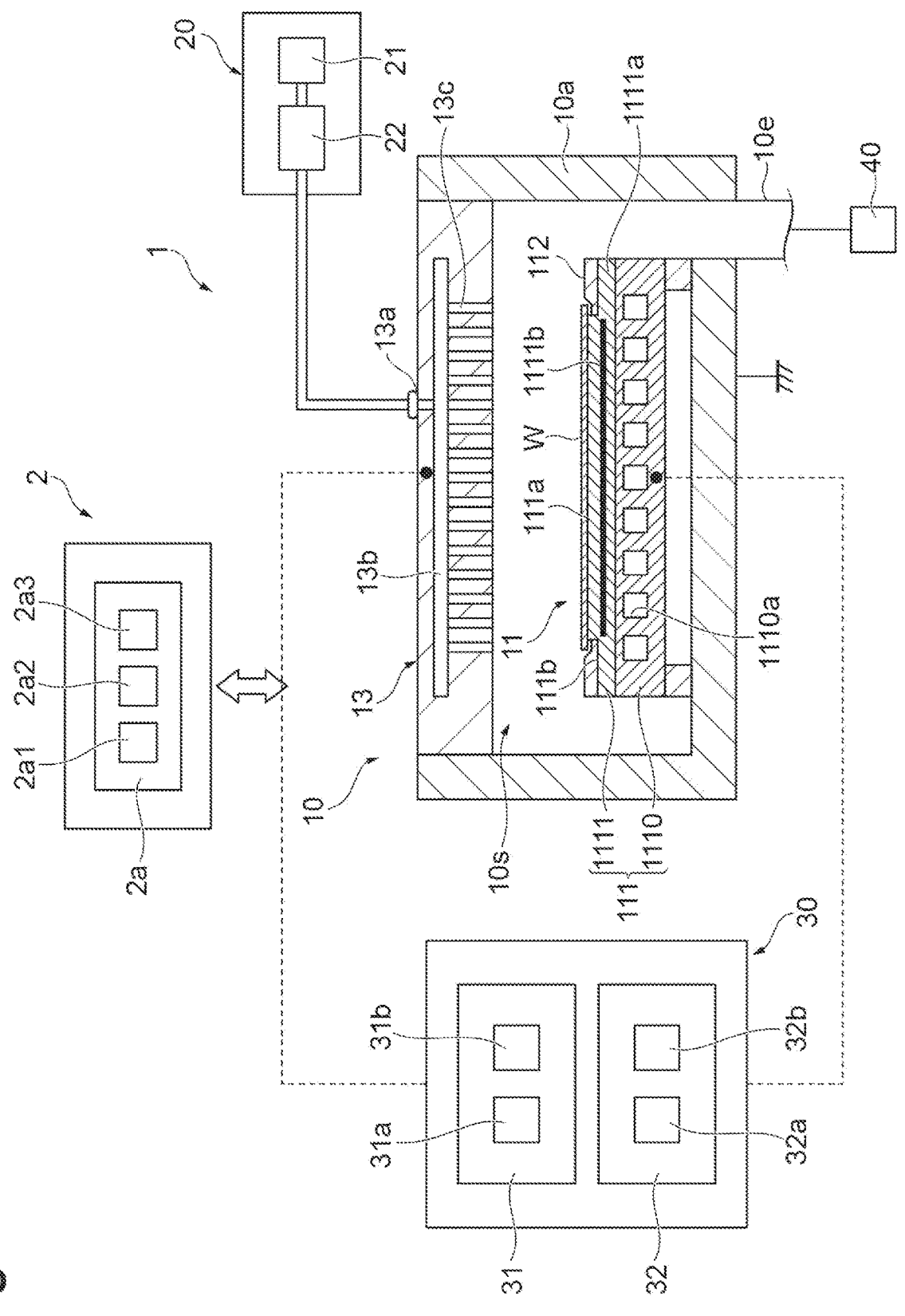
FIG. 2 illustrates an example configuration of a capacitively coupled plasma processing apparatus.

An example configuration of a capacitively coupled plasma processing apparatus, which is an example of the plasma processing apparatus 1, will now be described. FIG. 2 illustrates the example configuration of the capacitively coupled plasma processing apparatus.

The capacitively coupled plasma processing apparatus 1 includes a plasma processing chamber 10, a gas supply 20, an electric power source 30, and a gas exhaust system 40. The plasma processing apparatus 1 further includes a substrate support 11 and a gas introduction unit. The gas introduction unit is configured to introduce at least one process gas into the plasma processing chamber 10. The gas introduction unit includes a showerhead 13. The substrate support 11 is disposed in a plasma processing chamber 10. The showerhead 13 is disposed above the substrate support 11. In an embodiment, the showerhead 13 functions as at least part of the ceiling of the plasma processing chamber 10. The plasma processing chamber 10 has a plasma processing space 10s that is defined by the showerhead 13, the sidewall 10a of the plasma processing chamber 10, and the substrate support 11. The plasma processing chamber 10 is grounded. The showerhead 13 and the substrate support 11 are electrically insulated from the housing of the plasma processing chamber 10.

The substrate support 11 includes a body 111 and a ring assembly 112. The body 111 has a central region 111a for supporting a substrate W and an annular region 111b for supporting the ring assembly 112. An example of the substrate W is a wafer. The annular region 111b of the body 111 surrounds the central region 111a of the body 111 in plan view. The substrate W is disposed on the central region 111a of the body 111, and the ring assembly 112 is disposed on the annular region 111b of the body 111 so as to surround the substrate W on the central region 111a of the body 111. Thus, the central region 111a is also called a substrate supporting surface for supporting the substrate W, while the annular region 111b is also called a ring supporting surface for supporting the ring assembly 112.

In an embodiment, the body 111 includes a base 1110 and an electrostatic chuck 1111. The base 1110 includes a conductive member. The conductive member of the base 1110 can function as a lower electrode. The electrostatic chuck 1111 is disposed on the base 1110. The electrostatic chuck 1111 includes a ceramic member 1111a and an electrostatic electrode 1111b disposed in the ceramic member 1111a. The ceramic member 1111a has the central region 111a. In an embodiment, the ceramic member 1111a also has the annular region 111b. Any other member, such as an annular electrostatic chuck or an annular insulting member, surrounding the electrostatic chuck 1111 may have the annular region 111b. In this case, the ring assembly 112 may be disposed on either the annular electrostatic chuck or the annular insulating member, or both the electrostatic chuck 1111 and the annular insulating member. At least one RF/DC electrode coupled to an RF source 31 and/or a DC source 32 described below may be disposed in the ceramic member 1111a. In this case, the at least one RF/DC electrode functions as the lower electrode. If a bias RF signal and/or DC signal described below are supplied to the at least one RF/DC electrode, the RF/DC electrode is also called a bias electrode. It is noted that the conductive member of the base 1110 and the at least one RF/DC electrode may each function as a lower electrode. The electrostatic electrode 1111b may also be function as a lower electrode. The substrate support 11 accordingly includes at least one lower electrode.

The ring assembly 112 includes one or more annular members. In an embodiment, the annular members include one or more edge rings and at least one cover ring. The edge ring is composed of a conductive or insulating material, whereas the cover ring is composed of an insulating material.

The substrate support 11 may also include a temperature adjusting module that is configured to adjust at least one of the electrostatic chuck 1111, the ring assembly 112, and the substrate to a target temperature. The temperature adjusting module may be a heater, a heat transfer medium, a flow passage 1110a, or any combination thereof. A heat transfer fluid, such as brine or gas, flows into the flow passage 1110a. In an embodiment, the flow passage 1110a is formed in the base 1110, one or more heaters are disposed in the ceramic member 1111a of the electrostatic chuck 1111. The substrate support 11 may further include a heat transfer gas supply configured to supply a heat transfer gas to a gap between the rear surface of the substrate W and the central region 111a.

The showerhead 13 is configured to introduce at least one process gas from the gas supply 20 into the plasma processing space 10s. The showerhead 13 has at least one gas inlet 13a, at least one gas diffusing space 13b, and a plurality of gas feeding ports 13c. The process gas supplied to the gas inlet 13a passes through the gas diffusing space 13b and is then introduced into the plasma processing space 10s from the gas feeding ports 13c. The showerhead 13 further includes at least one upper electrode. The gas introduction unit may include one or more side gas injectors provided at one or more openings formed in the sidewall 10a, in addition to the showerhead 13.

The gas supply 20 may include at least one gas source 21 and at least one flow controller 22. In an embodiment, the gas supply 20 is configured to supply at least one process gas from the corresponding gas source 21 through the corresponding flow controller 22 into the showerhead 13. Each flow controller 22 may be, for example, a mass flow controller or a pressure-controlled flow controller. The gas supply 20 may include a flow modulation device that can modulate or pulse the flow of the at least one process gas.

The electric power source 30 include an RF source 31 coupled to the plasma processing chamber 10 through at least one impedance matching circuit. The RF source 31 is configured to supply at least one RF signal (RF power) to at least one lower electrode and/or at least one upper electrode. A plasma is thereby formed from at least one process gas supplied into the plasma processing space 10s. Thus, the RF source 31 can function as at least part of the plasma generator 12. The bias RF signal supplied to the at least one lower electrode causes a bias potential to occur in the substrate W, which potential then attracts ionic components in the plasma to the substrate W.

In an embodiment, the RF source 31 includes a first RF generator 31a and a second RF generator 31b. The first RF generator 31a is coupled to the at least one lower electrode and/or the at least one upper electrode through the at least one impedance matching circuit and is configured to generate a source RF signal (source RF power) for generating a plasma. In an embodiment, the source RF signal has a frequency in a range of 10 MHz to 150 MHz. In an embodiment, the first RF generator 31a may be configured to generate two or more source RF signals having different frequencies. The resulting source RF signal(s) is supplied to the at least one lower electrode and/or the at least one upper electrode.

The second RF generator 31b is coupled to the at least one lower electrode through the at least one impedance matching circuit and is configured to generate a bias RF signal (bias RF power). The bias RF signal and the source RF signal may have the same frequency or different frequencies. In an embodiment, the bias RF signal has a frequency which is less than that of the source RF signal. In an embodiment, the bias RF signal has a frequency in a range of 100 kHz to 60 MHz. In an embodiment, the second RF generator 31b may be configured to generate two or more bias RF signals having different frequencies. The resulting bias RF signal(s) is supplied to the at least one lower electrode. In various embodiments, at least one of the source RF signal and the bias RF signal may be pulsed.

The electric power source 30 may also include a DC source 32 coupled to the plasma processing chamber 10. The DC source 32 includes a first DC generator 32a and a second DC generator 32b. In an embodiment, the first DC generator 32a is connected to the at least one lower electrode and is configured to generate a first DC signal. The resulting first DC signal is applied to the at least one lower electrode. In an embodiment, the second DC generator 32b is connected to the at least one upper electrode and is configured to generate a second DC signal. The resulting second DC signal is applied to the at least one upper electrode.

In various embodiments, the first and second DC signals may be pulsed. In this case, a sequence of voltage pulses is applied to the at least one lower electrode and/or the at least one upper electrode. The voltage pulses have rectangular, trapezoidal, or triangular waveform, or a combined waveform thereof. In an embodiment, a waveform generator for generating a sequence of voltage pulses from the DC signal is disposed between the first DC generator 32a and the at least one lower electrode. The first DC generator 32a and the waveform generator thereby functions as a voltage pulse generator. In the case that the second DC generator 32b and the waveform generator functions as a voltage pulse generator, the voltage pulse generator is connected to the at least one upper electrode. The voltage pulse may have positive polarity or negative polarity. A sequence of voltage pulses may also include one or more positive voltage pulses and one or more negative voltage pulses in a cycle. The first and second DC generators 32a, 32b may be disposed in addition to the RF source 31, or the first DC generator 32a may be disposed in place of the second RF generator 31b.

The gas exhaust system 40 may be connected to, for example, a gas outlet 10e provided in the bottom wall of the plasma processing chamber 10. The gas exhaust system 40 may include a pressure regulation valve and a vacuum pump. The pressure regulation valve enables the pressure in the plasma processing space 10s to be adjusted. The vacuum pump may be a turbo-molecular pump, a dry pump, or a combination thereof.

Figure 3:
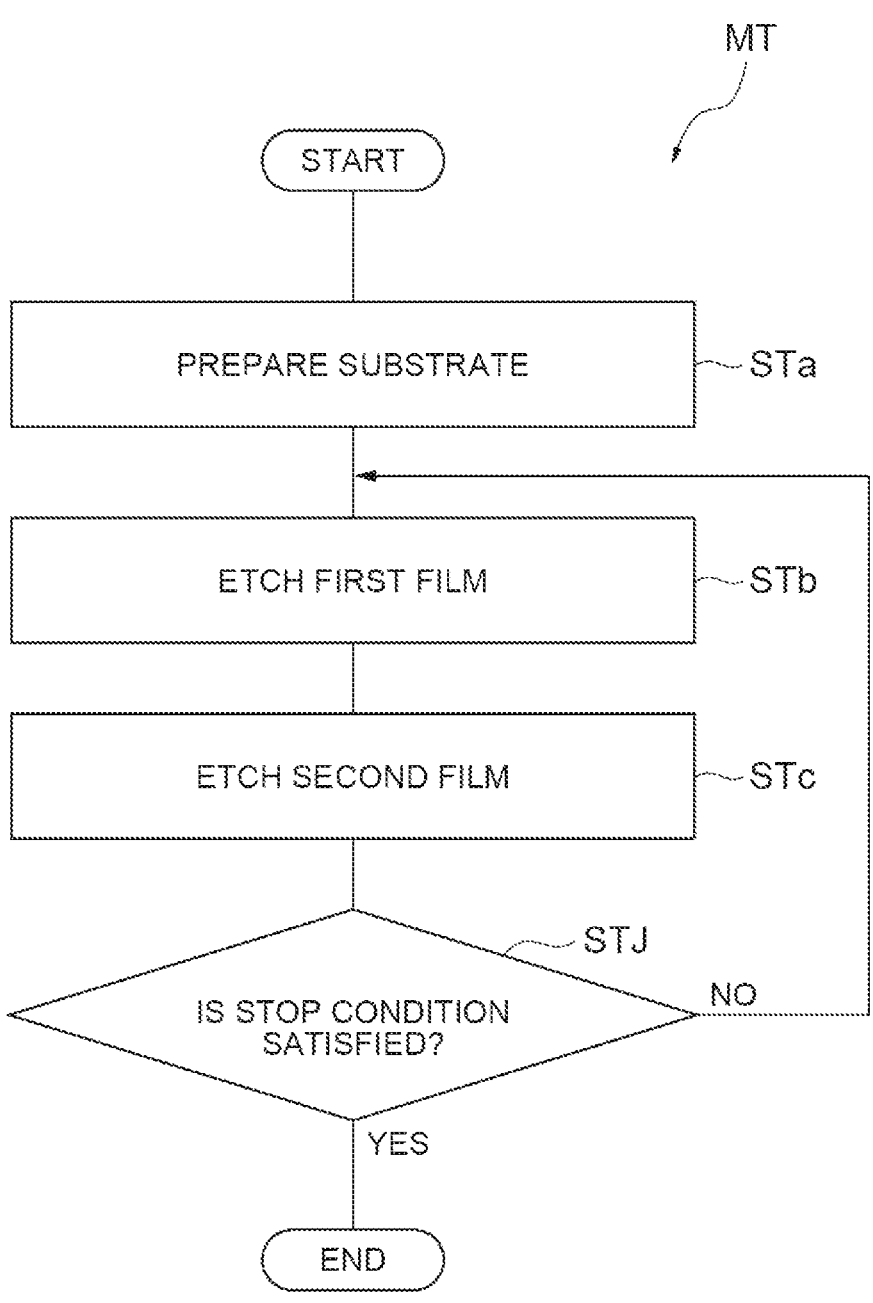
FIG. 3 illustrates an etching method according to an exemplary embodiment.

Hereinafter, an etching method according to an exemplary embodiment will be described with reference to FIG. 3. FIG. 3 is a flowchart illustrating an etching method according to an exemplary embodiment. An etching method (referred to as a "method MT" below) illustrated in FIG. 3 will be described below by taking, as an example, a case where a plasma processing apparatus 1 is used. In addition, the control of each part of the plasma processing apparatus 1 by a controller 2 in the method MT will be described. It should be noted that the method MT may be performed by using a plasma processing apparatus other than the plasma processing apparatus 1.

As illustrated in FIG. 3, the method MT starts in Step STa. A substrate W is prepared on a substrate support 11. The substrate W is placed on an electrostatic chuck 1111 and held by the electrostatic chuck 1111.

Figures 4A, 4B:
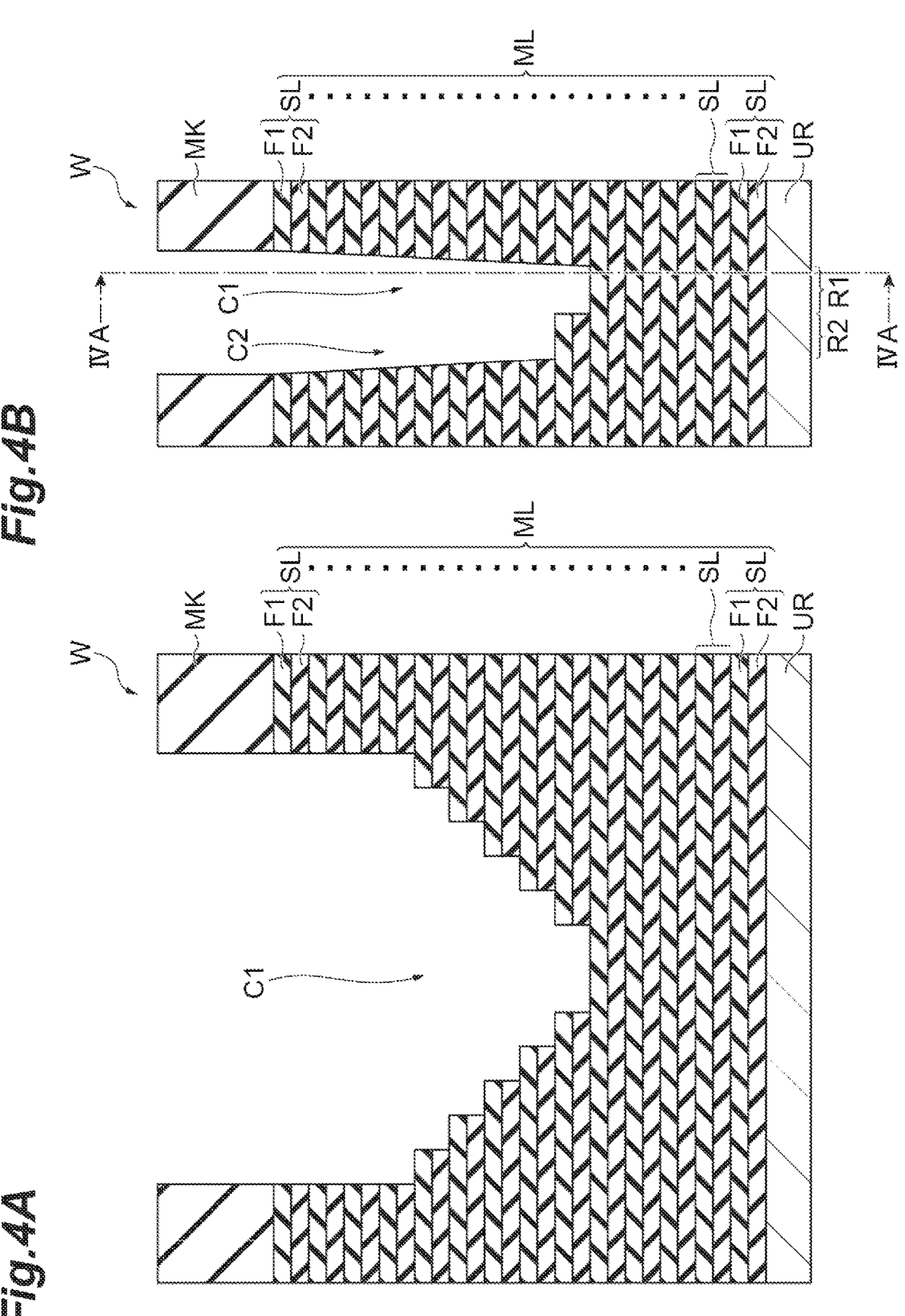
FIGS. 4A and 4B are cross-sectional views illustrating an example of a substrate.

FIGS. 4A and 4B are cross-sectional views illustrating an example of a substrate. FIG. 4A illustrates a cross-section of the substrate W illustrated in FIG. 4B taken along line IVA-IVA. The substrate W includes a multilayer film ML. The substrate W may further include a mask MK. The mask MK may be disposed on the multilayer film ML. The mask MK is formed of a material selected for selectively etching the multilayer film ML with respect to the mask MK. The mask MK may be formed of an organic film such as amorphous carbon. In addition, the substrate W may further include an underlying region UR. The multilayer film ML may be disposed on the underlying region UR. The underlying region UR may be formed of tungsten.

The multilayer film ML includes a plurality of first films F1 and a plurality of second films F2. The plurality of first films F1 and the plurality of second films F2 are alternately stacked. The plurality of first films F1 and the plurality of second films F2 form a plurality of stacked films SL. The plurality of stacked films SL are stacked in order. Each of the plurality of stacked films SL includes the first film F1 and the second film F2. In the stacked film SL, the first film F1 is disposed on the second film F2.

Each of the plurality of first films F1 is formed of a material different from the material of each of the plurality of second films F2. Each of the plurality of first films F1 and each of the plurality of second films F2 may be formed of silicon-containing materials different from each other. Each of the plurality of first films F1 may be formed of silicon oxide, and each of the plurality of second films F2 may be formed of silicon nitride. Each of the plurality of first films F1 may be formed of silicon nitride, and each of the plurality of second films F2 may be formed of silicon oxide.

In an embodiment, the multilayer film ML provides a first region R1 and a second region R2 below an opening of the mask MK, as illustrated in FIG. 4B. The second region R2 is adjacent to the first region R1. As illustrated in FIG. 4A, each of the first region R1 and the second region R2 has a step shape in a cross-section perpendicular to a direction in which the first region R1 and the second region R2 are arranged. As illustrated in FIG. 4B, the depth of a first recess C1 defined by the first region R1 below the opening of the mask MK is deeper than the depth of a second recess C2 defined by the second region R2 below the opening of the mask MK. In the following description, the direction in which the first region R1 and the second region R2 are arranged is referred to as an X-direction. Further, a direction perpendicular to the depth direction of the multilayer film ML and the X-direction is referred to as a Y-direction.

In the following, reference is made to FIGS. 5A, 5B, 6A, 6B, 7A, and 7B, together with FIGS. 3, 4A, and 4B. Each of FIGS. 5A, 5B, 6A, 6B, 7A, and 7B is a cross-sectional view illustrating an example of a substrate to which a corresponding step of the etching method illustrated in FIG. 3 is applied.

Figures 5A, 5B:
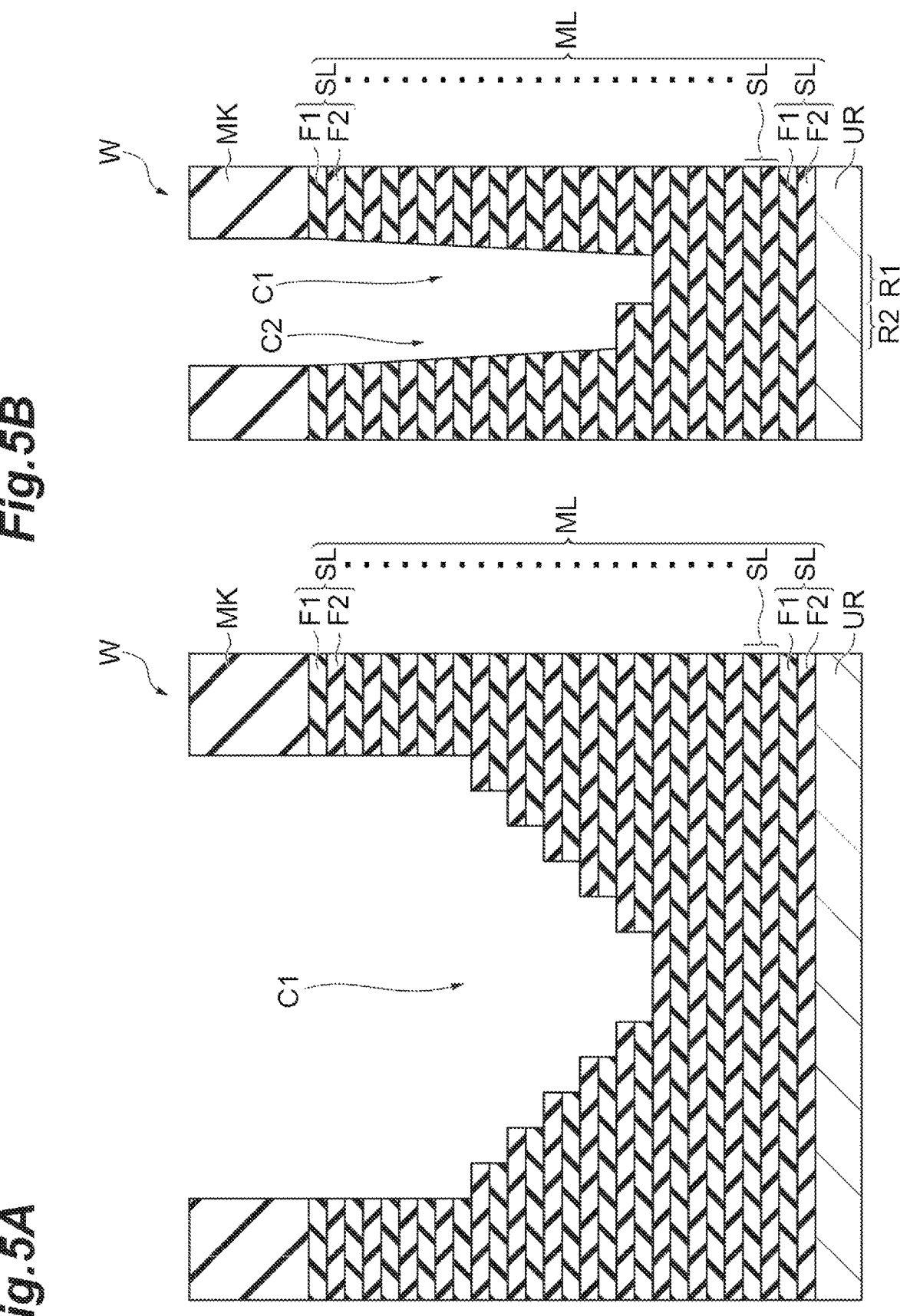
FIGS. 5A and 5B are cross-sectional views illustrating an example of a substrate to which a corresponding step of the etching method illustrated in FIG. 3 is applied.

As illustrated in FIG. 3, Step STb is performed after Step STa, in the method MT. In Step STb, by generating plasma from a first process gas in a chamber 10, one or more first films F1 among the plurality of first films F1 are etched, as illustrated in FIGS. 5A and 5B. In Step STb, a region on which neither the mask MK nor any other layer of the multilayer film ML is present is etched in the entire region of each of the one or more first films F1. The first process gas may contain a fluorocarbon gas. The first process gas may further contain an oxygen-containing gas (for example, an oxygen gas) and/or a noble gas.

In Step STb, the controller 2 controls a gas supply 20 to supply the first process gas into the chamber 10. In Step STb, the controller 2 controls an exhaust system 40 to set the pressure in the chamber 10 to designated pressure. In Step STb, the controller 2 controls a plasma generator 12 to generate plasma from the first process gas in the chamber 10. In an embodiment, the controller 2 controls a first RF generator 31a to supply source radio frequency power HF (that is, a first RF signal) in order to generate plasma from the first process gas. Further, in Step STb, the controller 2 controls a bias power source to supply an electric bias EB to the substrate support 11 (or a lower electrode) in order to attract ions from the plasma in the chamber 10. The bias power source is a second RF generator 31b or a first DC generator 32a. That is, the electric bias EB may be bias radio frequency power. Alternatively, the electric bias EB may be a pulsed first DC signal, that is, a sequence of voltage pulses.

Figures 6A, 6B:
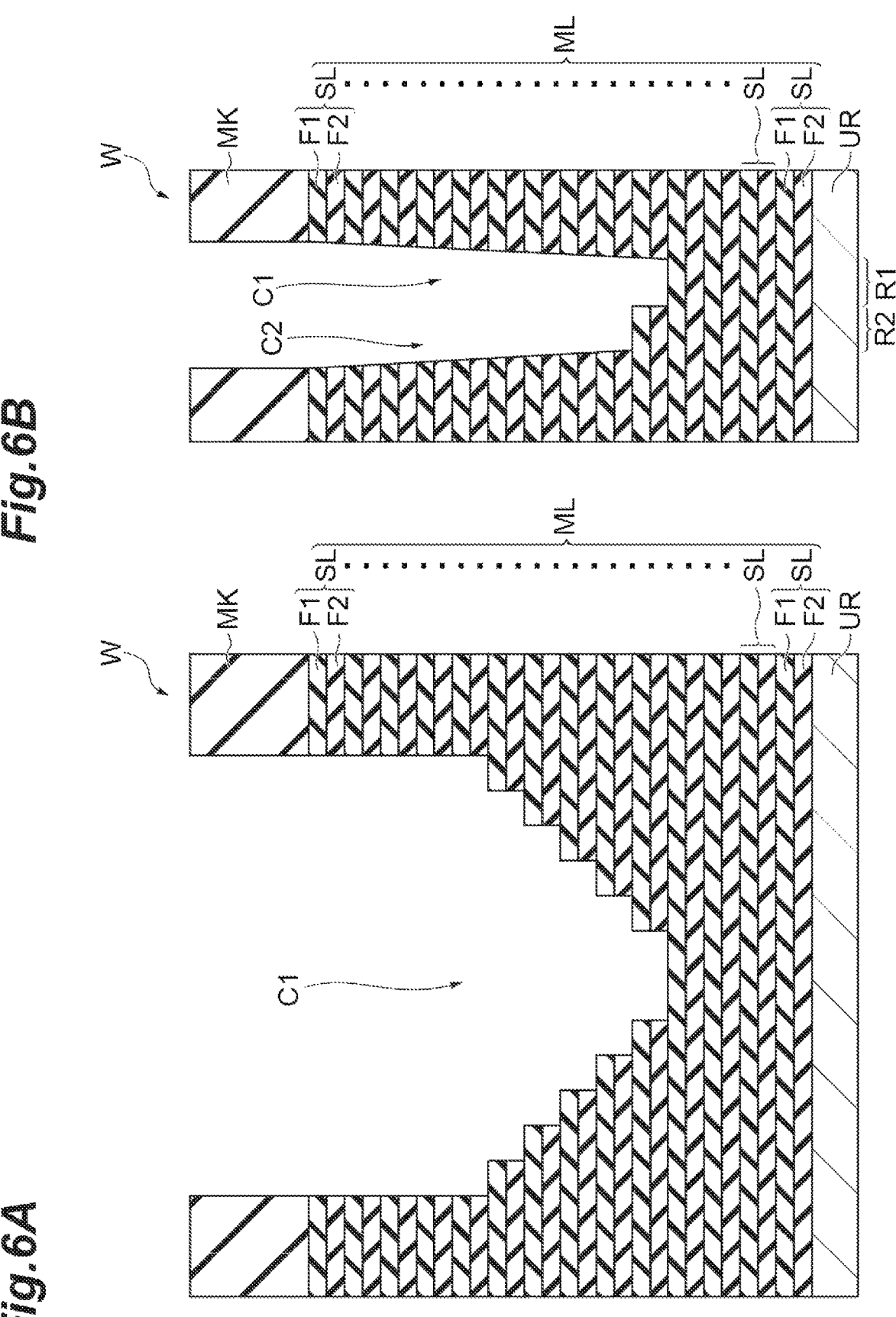
FIGS. 6A and 6B are cross-sectional views illustrating another example of the substrate to which a corresponding step of the etching method illustrated in FIG. 3 is applied.

As illustrated in FIG. 3, Step STc is performed after Step STb, in the method MT. In Step STc, by generating plasma from the second process gas in the chamber 10, one or more second films F2 among the plurality of second films F2 are etched as illustrated in FIGS. 6A and 6B. In Step STc, a region on which neither the mask MK nor any other layer of the multilayer film ML is present is etched in the entire region of each of the one or more second films F2. The second process gas may contain a hydrofluorocarbon gas. The second process gas may further contain an oxygen-containing gas (for example, an oxygen gas) and a noble gas. The second process gas may further contain a fluorocarbon gas.

In Step STc, the controller 2 controls the gas supply 20 to supply the second process gas into the chamber 10. In Step STc, the controller 2 controls the exhaust system 40 to set the pressure in the chamber 10 to designated pressure. In Step STc, the controller 2 controls a plasma generator 12 to generate plasma from the second process gas in the chamber 10. In an embodiment, the controller 2 controls the first RF generator 31a to supply the source radio frequency power HF in order to generate plasma from the second process gas. Further, in Step STc, the controller 2 controls the bias power source to supply the electric bias EB to the substrate support 11 (or a lower electrode) in order to attract ions from the plasma in the chamber 10.

Figures 7A, 7B:
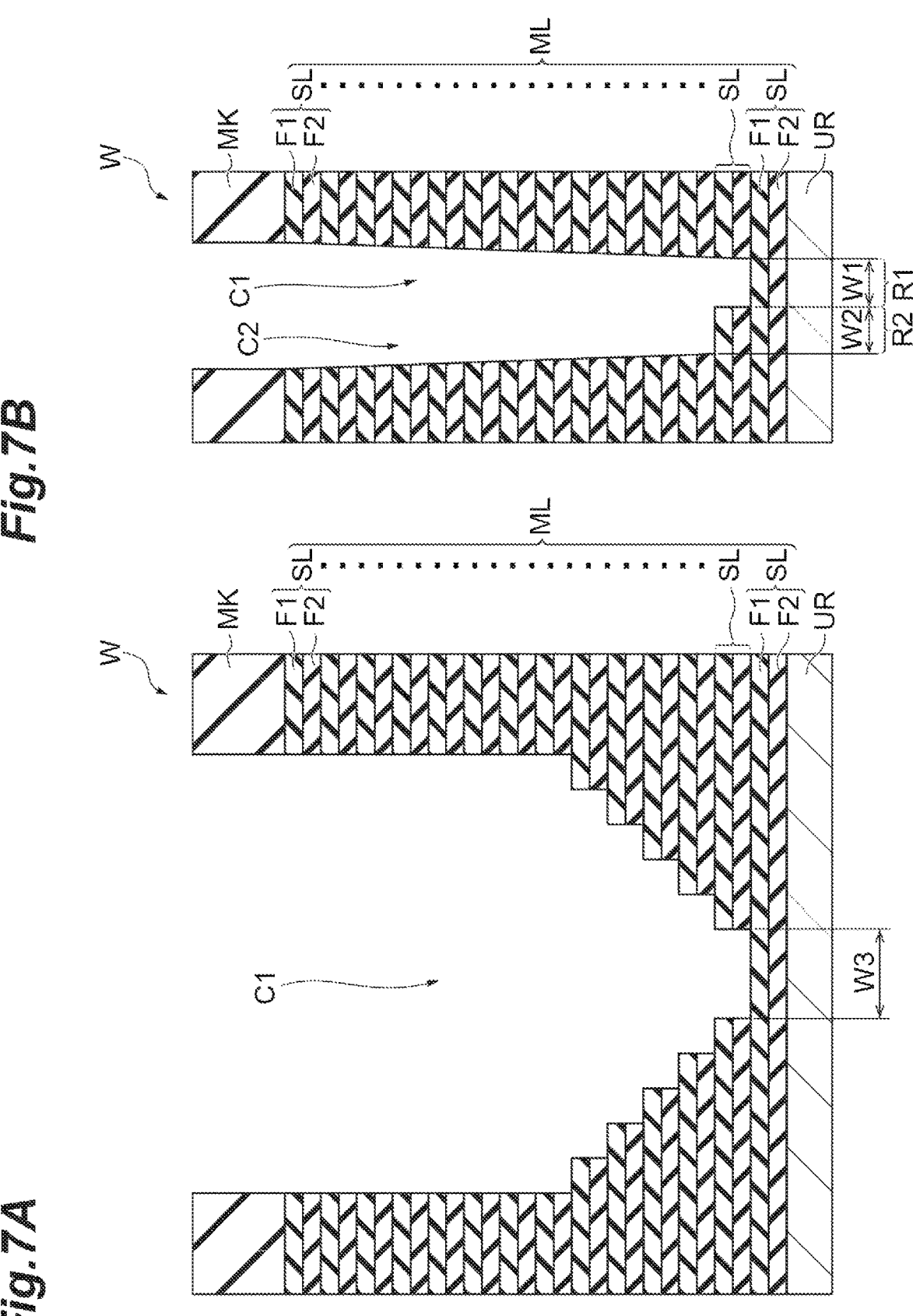
FIGS. 7A and 7B are cross-sectional views illustrating still another example of the substrate to which a corresponding step of the etching method illustrated in FIG. 3 is applied.

In an embodiment, Step STb and Step STc may be alternately repeated. In this case, whether or not a stop condition is satisfied is determined, in Step STJ. The stop condition is satisfied when the number of times of alternate repetitions of Step STb and Step STc reaches a predetermined number of times. When it is determined, in Step STJ, that the stop condition is not satisfied, Step STb and Step STc are repeated in order. By alternately repeating Step STb and Step STc, the multilayer film ML is etched as illustrated in FIGS. 7A and 7B. On the other hand, when it is determined, in Step STJ, that the stop condition is satisfied, the method MT is ended.

In each of Step STb and Step STc of the method MT, a pulse HFP of the source radio frequency power HF and a pulse EBP of the electric bias EB may be supplied intermittently or periodically.

Figure 8:
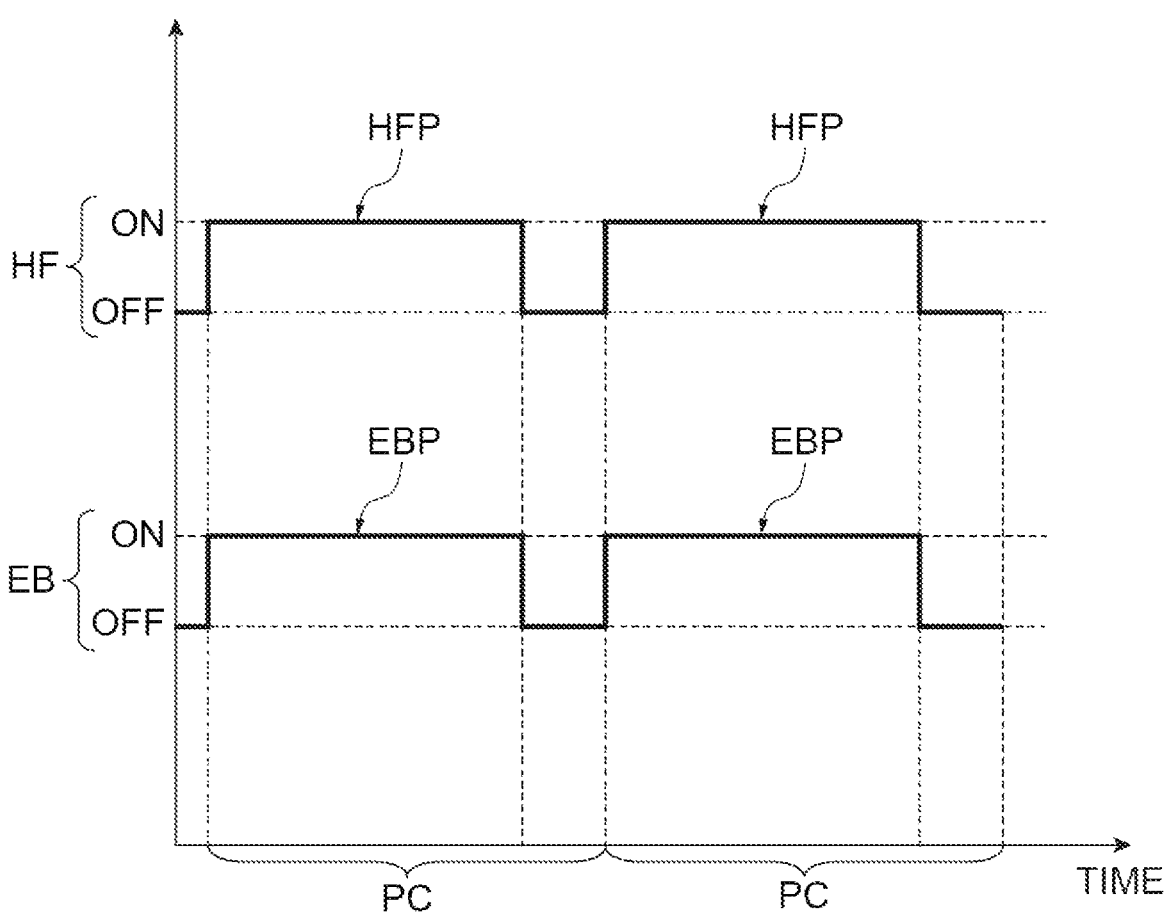
FIG. 8 is a timing chart of an example of source radio frequency power and an electric bias.
Figure 9:
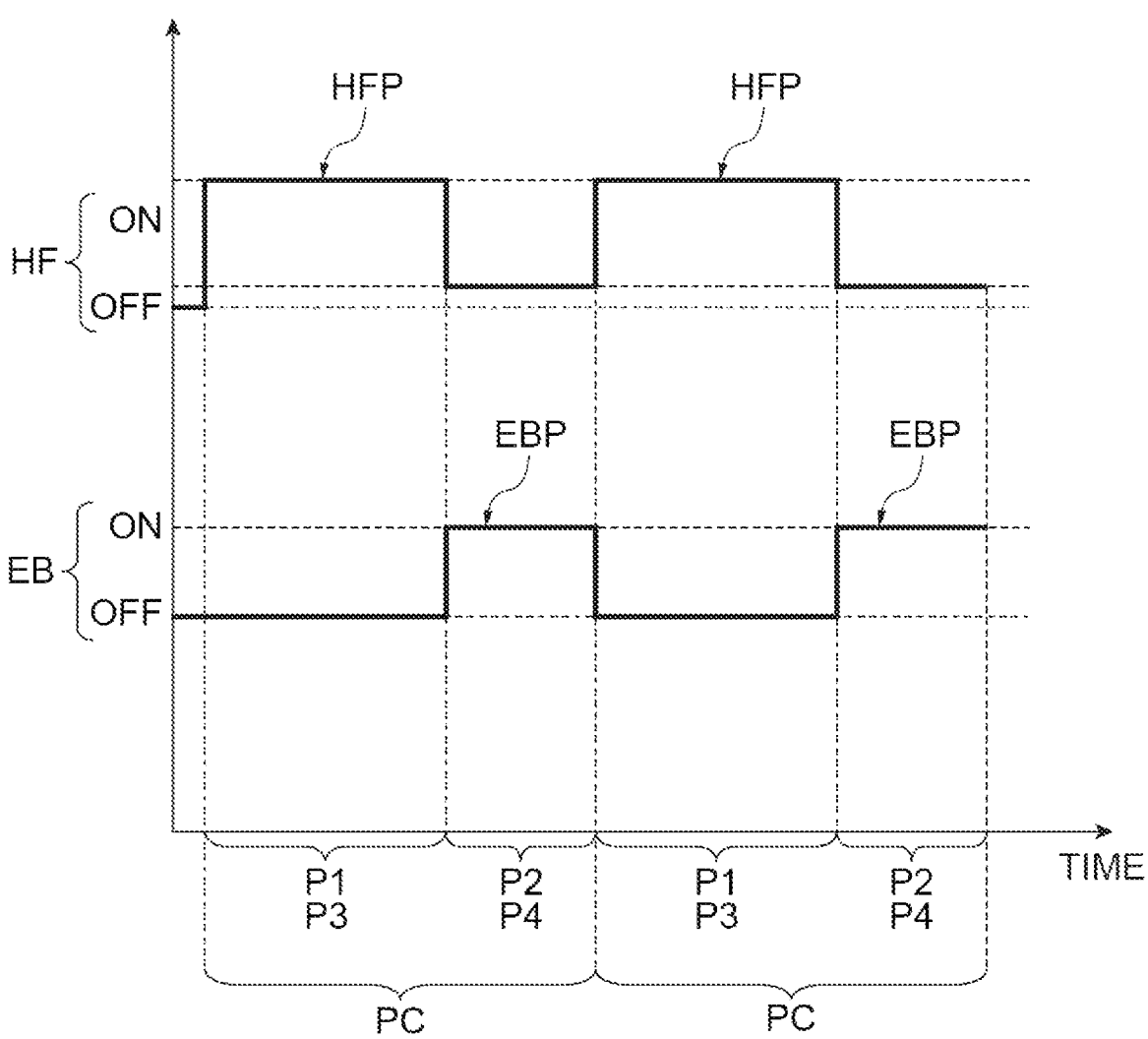
FIG. 9 is a timing chart of another example of the source radio frequency power and the electric bias.

FIGS. 8 and 9 are referred to below. Each of FIGS. 8 and 9 is a timing chart of an example of the source radio frequency power and the electric bias. In each of FIGS. 8 and 9, "ON" of the source radio frequency power HF indicates that the pulse HFP is supplied, and "OFF" of the source radio frequency power HF indicates that the pulse HFP is not supplied. In each of FIGS. 8 and 9, "ON" of the electric bias EB indicates that the pulse EBP is supplied, and "OFF" of the electric bias EB indicates that the pulse EBP is not supplied.

In an embodiment, as illustrated in FIG. 8, the pulse HFP and the pulse EBP may be synchronized with each other. That is, a supply start timing of the pulse HFP may be the same as a supply start timing of the pulse EBP, and an end timing of the pulse HFP may be the same as an end timing of the pulse EBP. In this case, the duty ratio of each of the pulse HFP and the pulse EBP may be 40% or more and 80% or less. The duty ratio is a ratio (%) of the time length of a period in which each of the pulse HFP and the pulse EBP is supplied to the time length of a pulse cycle PC.

In another embodiment, as illustrated in FIG. 9, the pulse cycle PC in Step STb may include a first period P1 and a second period P2. In addition, the pulse cycle PC in Step STc may include a third period P3 and a fourth period P4. The pulse HFP may be supplied in the first period P1 and the third period P3, and the pulse EBP may be supplied in the second period P2 and the fourth period P4.

The power level of the source radio frequency power HF in the second period P2 may be lower than the power level of the source radio frequency power HF in the first period P1. Further, the power level of the source radio frequency power HF in the fourth period P4 may be lower than the power level of the source radio frequency power HF in the third period P3.

The electric bias EB may have a level in the first period P1, which is lower than the level of the electric bias EB in the second period P2, or may be stopped in the first period P1. Further, the electric bias EB may have a level in the third period P3, which is lower than the level of the electric bias EB in the fourth period P4, or may be stopped in the third period P3. When the electric bias EB is the bias radio frequency power, the level of the electric bias EB is a power level thereof. When the electric bias EB includes a voltage pulse, the level of the electric bias EB increases as the voltage level of the voltage pulse has a larger difference from the reference voltage (for example, 0 V) in a negative direction, and increases as the absolute value of the negative level becomes larger.

Each of the ratio of the time length of the first period P1 in the pulse cycle PC and the ratio of the time length of the third period P3 in the pulse cycle PC, that is, the duty ratio may be 50% or more. This duty ratio may be 65% or more or 70% or more.

According to such a method MT, even when the depth of the recess of the substrate W is increased by etching the multilayer film ML, the expansion of the width of the recess is suppressed. For example, expansion of a width W1 in the X-direction (see FIG. 7B) and a width W3 in the Y-direction at the deepest portion of the first recess C1 is suppressed. In addition, expansion of a width W2 in the X-direction (see FIG. 7B) and a width in the Y-direction at the deepest portion of the second recess C2 is suppressed.

Figure 10:
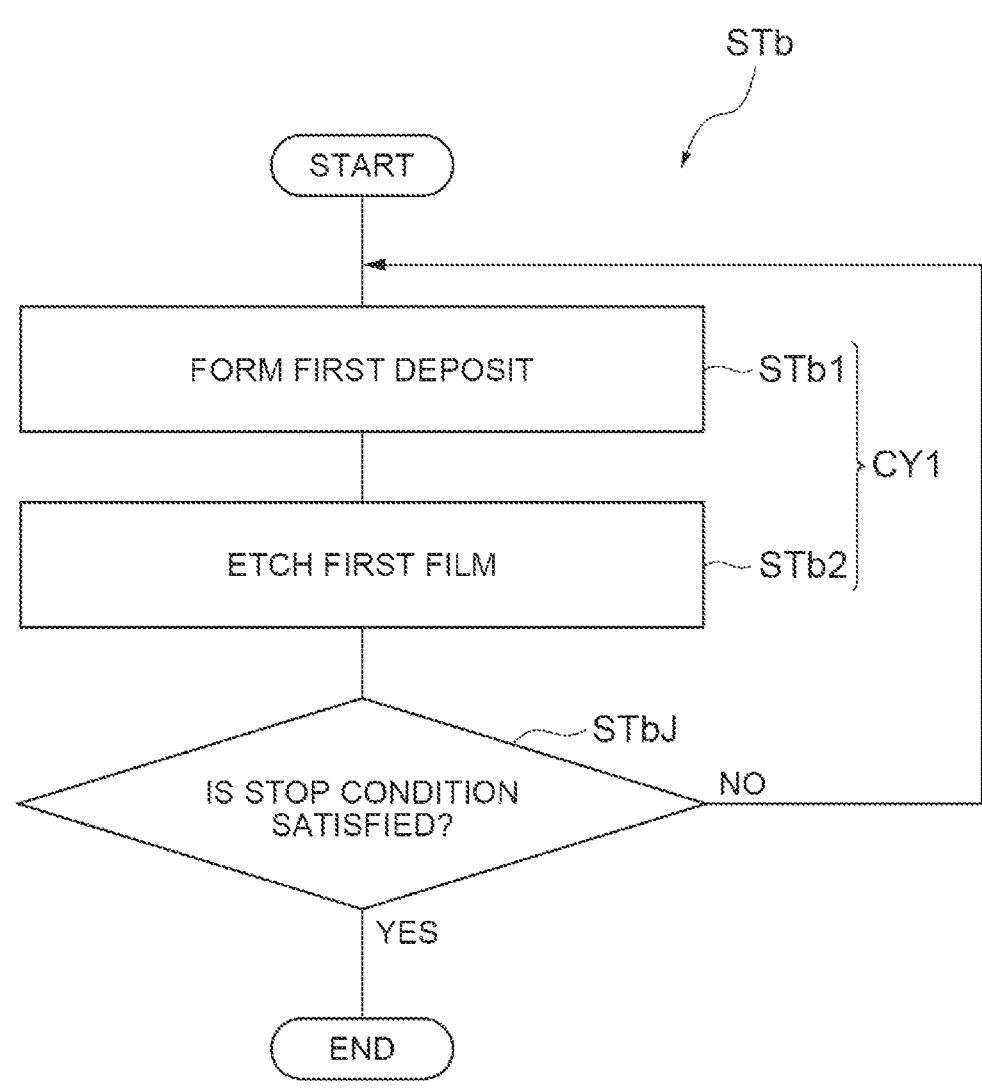
FIG. 10 is a flowchart illustrating an example of Step STb of the etching method illustrated in FIG. 3.
Figure 13:
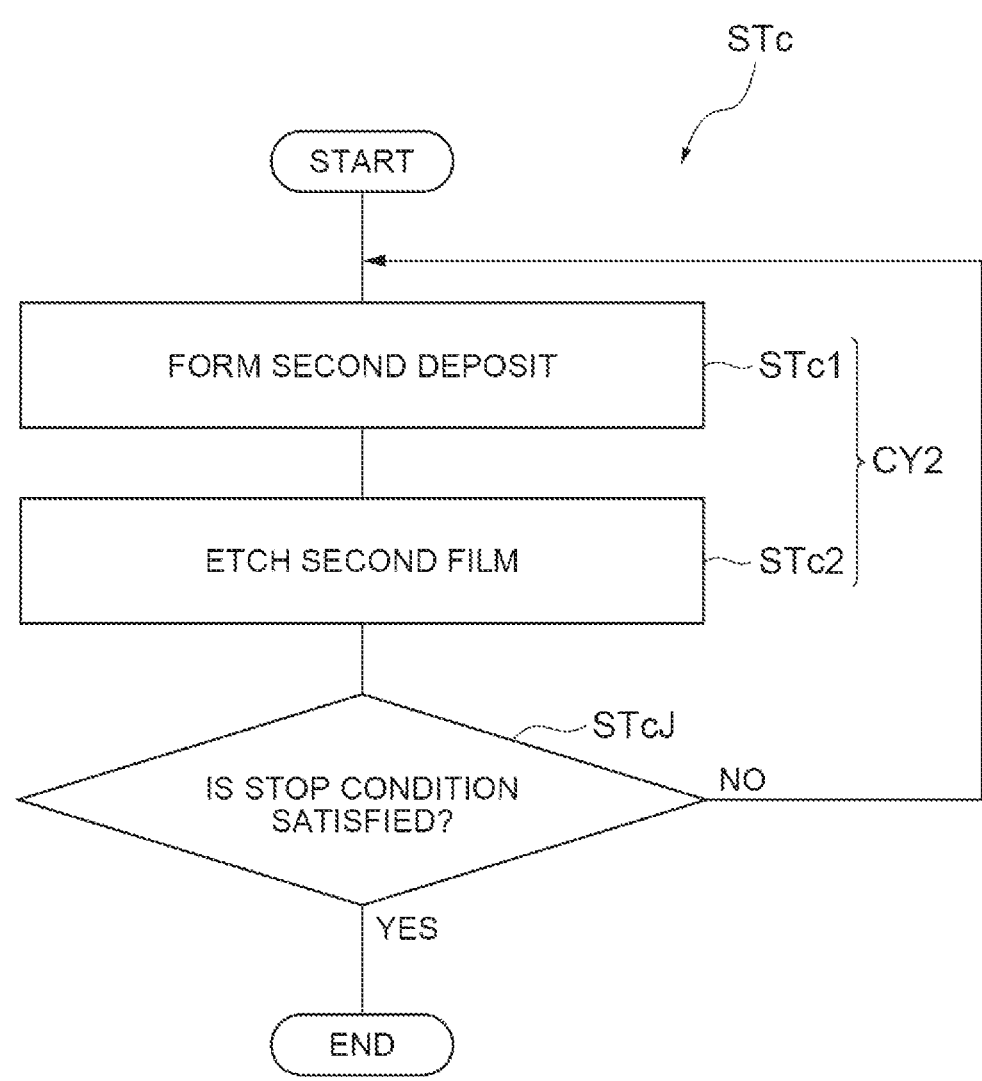
FIG. 13 is a flowchart illustrating an example of Step STc of the etching method illustrated in FIG. 3.

In the following, reference is made to FIGS. 10, 11A, 11B, 12A, 12B, 13, 14A, 14B, 15A, and 15B. FIG. 10 is a flowchart illustrating an example of Step STb of the etching method illustrated in FIG. 3. FIG. 13 is a flowchart illustrating an example of Step STc of the etching method illustrated in FIG. 3. Each of FIGS. 11A, 11B, 12A, 12B, 14A, 14B, 15A, and 15B is a cross-sectional view illustrating an example of a substrate to which a corresponding step of the etching method illustrated in FIG. 3 is applied.

In an embodiment, Step STb may include repeating a first cycle CY1 as illustrated in FIG. 10. The first cycle CY1 includes Step STb1 and Step STb2.

Figures 11A, 11B:
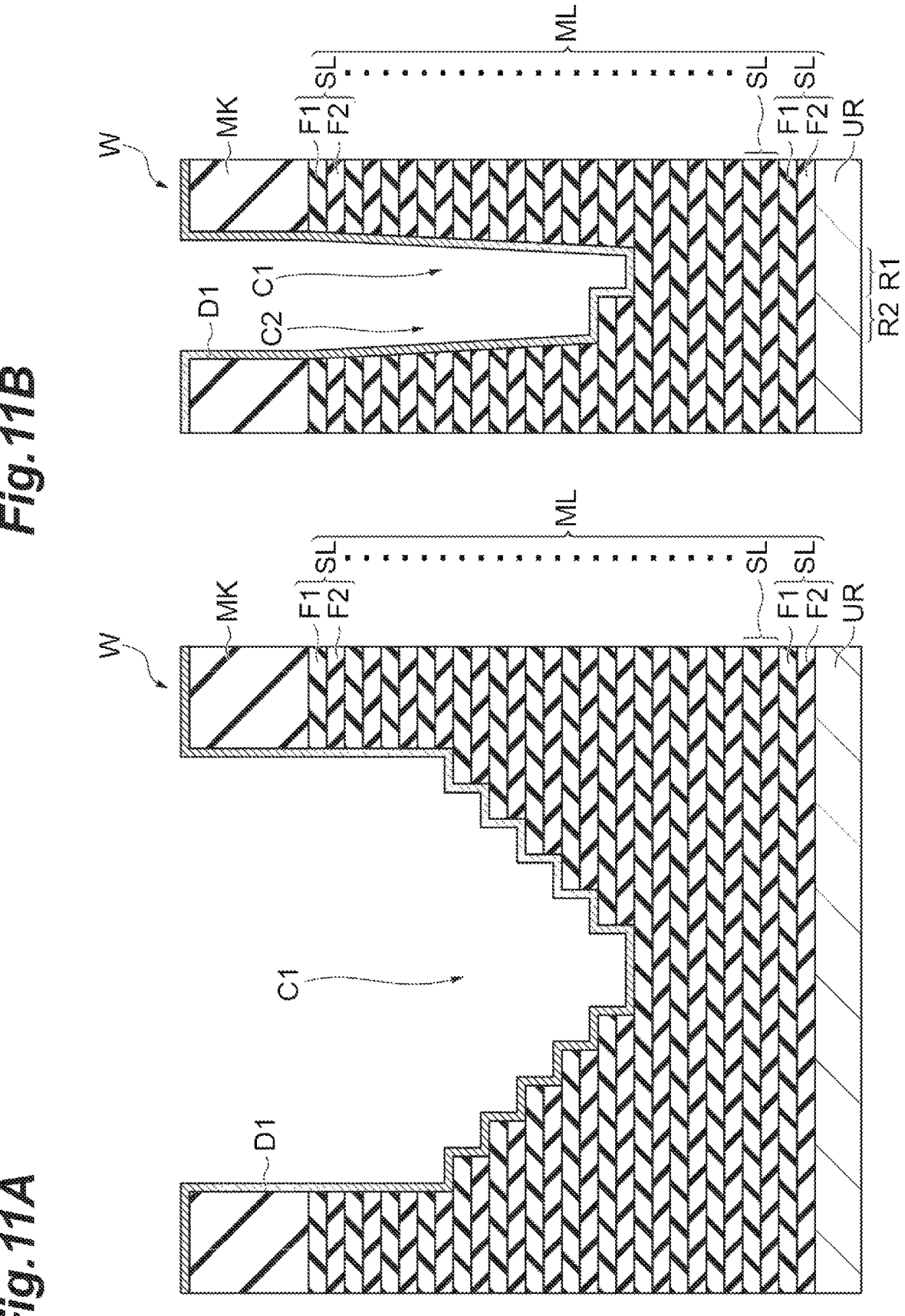
FIGS. 11A and 11B are cross-sectional views illustrating the example of the substrate to which the corresponding step of the etching method illustrated in FIG. 3 is applied.
Figures 12A, 12B:
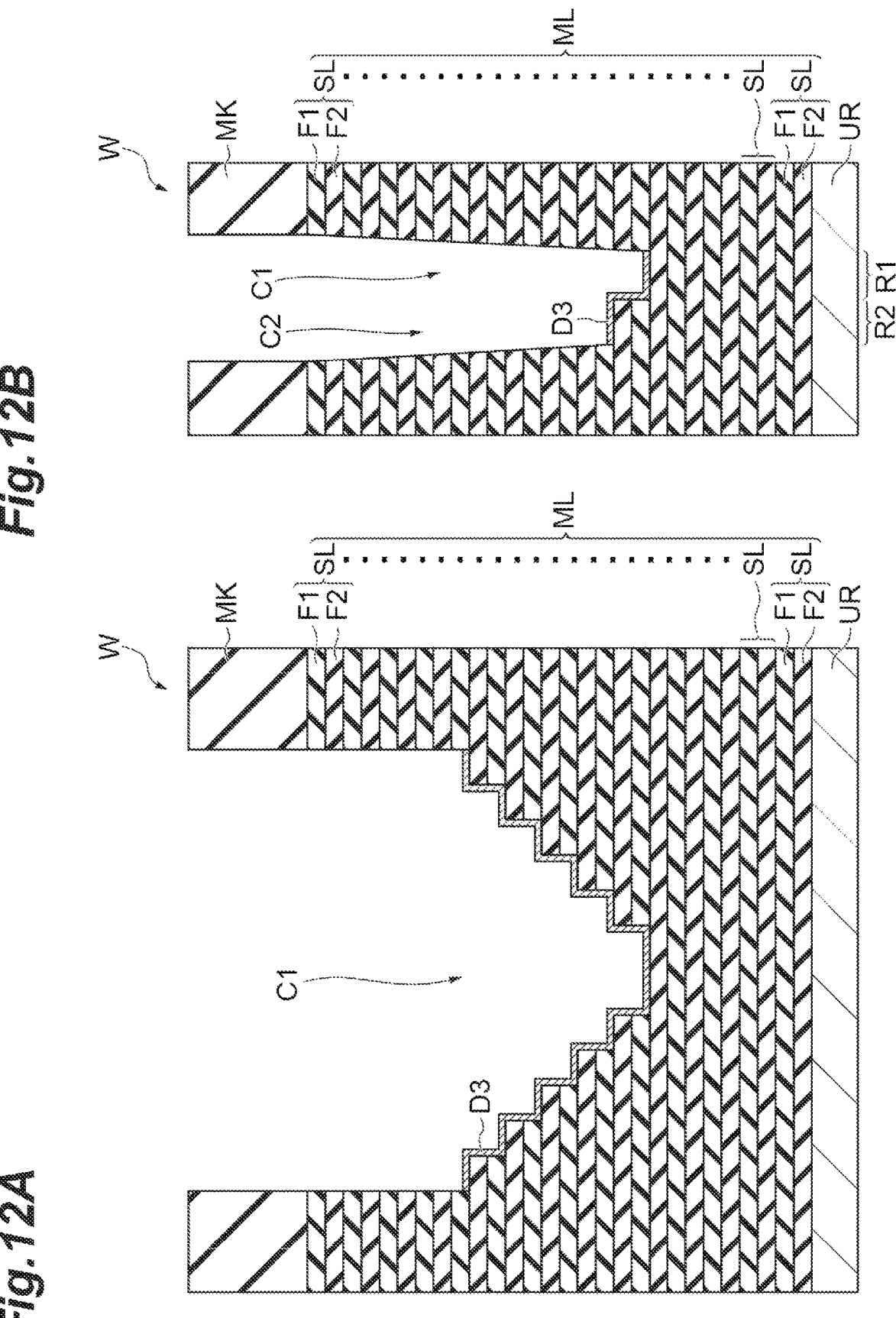
FIGS. 12A and 12B are cross-sectional views illustrating the example of the substrate to which a corresponding step of the etching method illustrated in FIG. 3 is applied.

Step STb1 is performed in the first period. In Step STb1, as illustrated in FIGS. 11A and 11B, a deposit D1 (first deposit) is formed on one or more first films F1 among the plurality of first films F1. The deposit D1 is formed on a region in the entire region of each of the one or more first films F1 on which neither the mask MK nor any other film of the multilayer film ML is present. The deposit D1 may be formed on the entire surface of the substrate W. The deposit D1 is supplied to the substrate W from the plasma generated from the first process gas described above in the chamber 10. A period in which Step STb1 is performed may be the first period P1 described above. That is, the pulse HFP may be supplied in Step STb1. In Step STb1, the electric bias EB may not be supplied, or the level of the electric bias EB may be set to a level lower than the level of the electric bias EB in Step STb2.

In Step STb1, the controller 2 controls a gas supply 20 to supply the first process gas into the chamber 10. In Step STb1, the controller 2 controls an exhaust system 40 to set the pressure in the chamber 10 to designated pressure. In Step STb1, the controller 2 controls a plasma generator 12 to generate plasma from the first process gas in the chamber 10. In an embodiment, the controller 2 controls a first RF generator 31a to supply source radio frequency power HF (or the pulse HFP thereof) in order to generate plasma from the first process gas.

Step STb2 is performed in the second period after the first period. In Step STb2, one or more first films F1 are etched by using plasma generated from the first process gas described above in the chamber 10, as illustrated in FIGS. 12A and 12B. In Step STb2, a region in the entire region of each of the one or more first films F1 on which neither the mask MK nor any other film of the multilayer film ML is present is etched. Further, in Step STb2, a reaction product generated by the etching is deposited on the substrate W as a deposit D3 (third deposit). A portion of the deposit D3 is formed on the side wall surface defining the recess formed in the substrate W, specifically, the side wall surface including the cross-section of the second film F2. A period in which Step STb2 is performed may be the second period P2 described above. That is, the electric bias EB is supplied in Step STb2. In Step STb2, the source radio frequency power HF may be supplied. In Step STb2, the power level of the source radio frequency power HF may be set to a level lower than the power level of the source radio frequency power HF in Step STb1.

In Step STb2, the controller 2 controls a gas supply 20 to supply the first process gas into the chamber 10. In Step STb2, the controller 2 controls an exhaust system 40 to set the pressure in the chamber 10 to designated pressure. In Step STb2, the controller 2 controls a plasma generator 12 to generate plasma from the first process gas in the chamber 10. In an embodiment, the controller 2 controls the first RF generator 31a to supply the source radio frequency power HF in order to generate plasma from the first process gas. In addition, the controller 2 controls the bias power source to supply the electric bias EB (or the pulse EBP thereof) to the substrate support 11 (or the lower electrode).

Step STb may further include Step STbJ. In Step STbJ, it is determined whether or not the stop condition is satisfied. The stop condition is satisfied when the number of times of performing the first cycle CY1 has reached a predetermined number of times. When it is determined, in Step STbJ, that the stop condition is not satisfied, the first cycle CY1 is performed again. On the other hand, when it is determined, in Step STbJ, that the stop condition is satisfied, Step STb is ended, and the process proceeds to Step STc.

In an embodiment, Step STc may include repeating a second cycle CY2 as illustrated in FIG. 13. The second cycle CY2 includes Step STc1 and Step STc2.

Figures 14A, 14B:
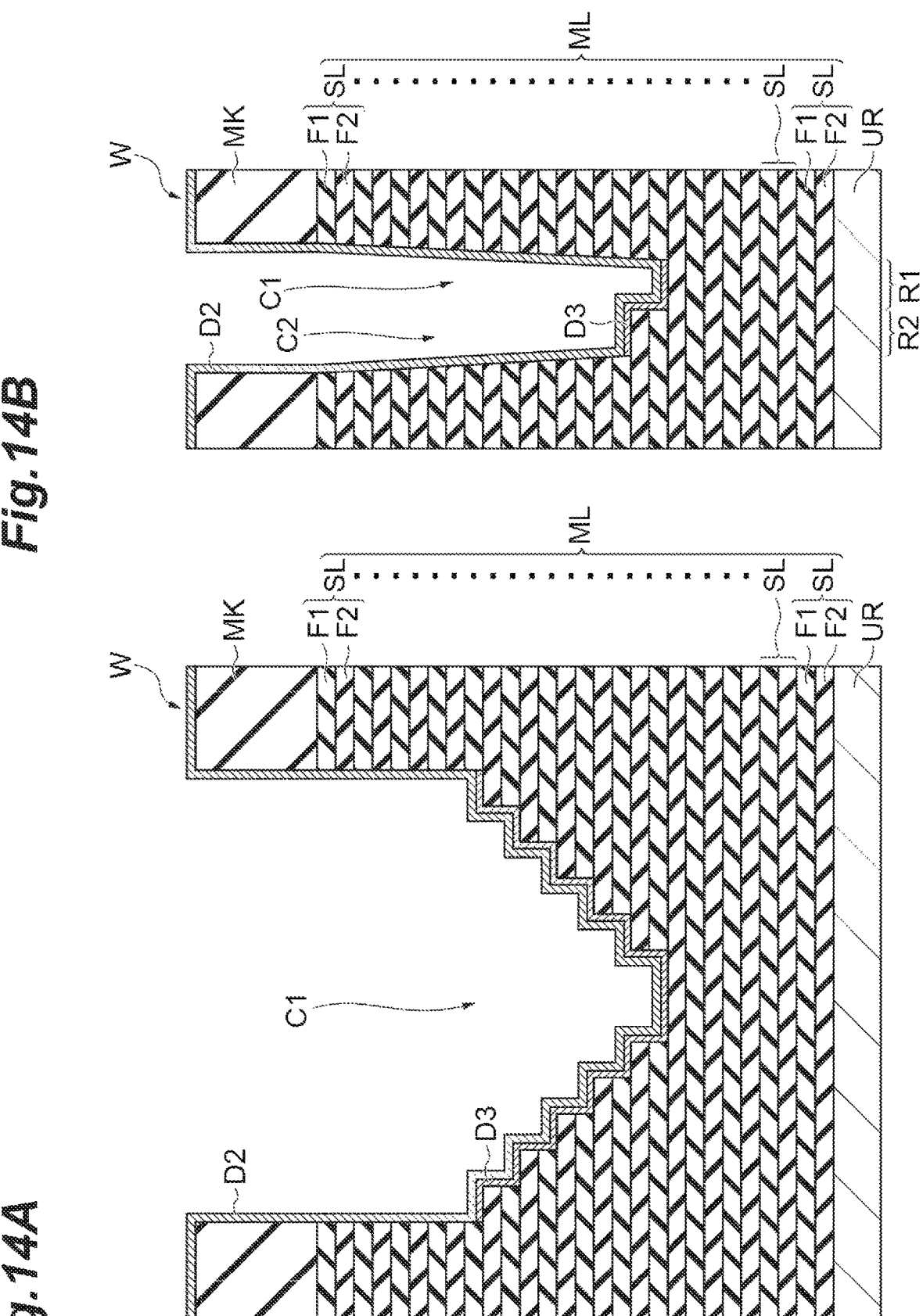
FIGS. 14A and 14B are cross-sectional views illustrating the example of the substrate to which a corresponding step of the etching method illustrated in FIG. 3 is applied.
Figures 15A, 15B:
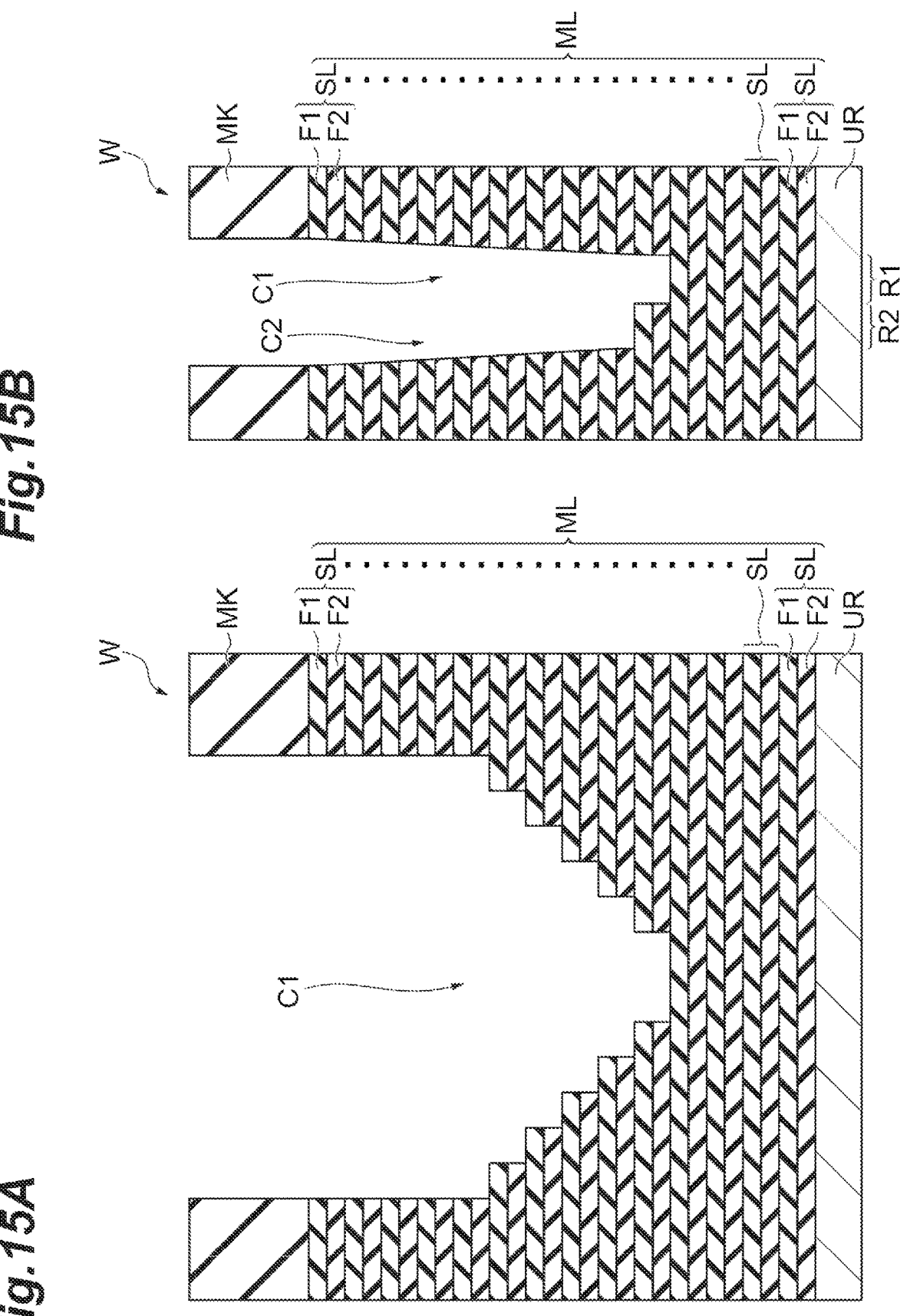
FIGS. 15A and 15B are cross-sectional views illustrating the example of the substrate to which a corresponding step of the etching method illustrated in FIG. 3 is applied.

Step STc1 is performed in the third period. In Step STc1, as illustrated in FIGS. 14A and 14B, a deposit D2 (second deposit) is formed on one or more second films F2 among the plurality of second films F2. The deposit D2 is formed on a region in the entire region of each of the one or more second films F2 on which neither the mask MK nor any other film of the multilayer film ML is present. The deposit D2 may be formed on the entire surface of the substrate W. The deposit D2 is supplied to the substrate W from the plasma generated from the second process gas described above in the chamber 10. A period in which Step STc1 is performed may be the third period P3 described above. That is, the pulse HFP may be supplied in Step STc1. In Step STc1, the electric bias EB may not be supplied, or the level of the electric bias EB may be set to a level lower than the level of the electric bias EB in Step STc2.

In Step STc1, the controller 2 controls the gas supply 20 to supply the second process gas into the chamber 10. In Step STc1, the controller 2 controls the exhaust system 40 to set the pressure in the chamber 10 to designated pressure. In Step STc1, the controller 2 controls a plasma generator 12 to generate plasma from the second process gas in the chamber 10. In an embodiment, the controller 2 controls the first RF generator 31a to supply source radio frequency power HF (or the pulse HFP thereof) in order to generate plasma from the second process gas.

Step STc2 is performed in the fourth period after the third period. In Step STc2, one or more second films F2 are etched by using plasma generated from the second process gas described above in the chamber 10, as illustrated in FIGS.

15A and 15B. In Step STc2, a region in the entire region of each of the one or more second films F2 on which neither the mask MK nor any other film of the multilayer film ML is present is etched. In Step STc2, the deposit D3 is etched together with the one or more second films F2.

A period in which Step STc2 is performed may be the fourth period P4 described above. That is, the electric bias EB is supplied in Step STc2. In Step STc2, the source radio frequency power HF may be supplied. In Step STc2, the power level of the source radio frequency power HF may be set to a level lower than the power level of the source radio frequency power HF in Step STc1.

In Step STc2, the controller 2 controls the gas supply 20 to supply the second process gas into the chamber 10. In Step STc2, the controller 2 controls the exhaust system 40 to set the pressure in the chamber 10 to designated pressure. In Step STc2, the controller 2 controls a plasma generator 12 to generate plasma from the second process gas in the chamber 10. In an embodiment, the controller 2 controls the first RF generator 31a to supply the source radio frequency power HF in order to generate plasma from the second process gas. In addition, the controller 2 controls the bias power source to supply the electric bias EB (or the pulse EBP thereof) to the substrate support 11 (or the lower electrode).

Step STc may further include Step STcJ. In Step STcJ, it is determined whether or not the stop condition is satisfied. The stop condition is satisfied when the number of times of performing the second cycle CY2 has reached a predetermined number of times. When it is determined, in Step STcJ, that the stop condition is not satisfied, the second cycle CY2 is performed again. On the other hand, when it is determined, in Step STcJ, that the stop condition is satisfied, Step STc is ended.

While various exemplary embodiments have been described above, various additions, omissions, substitutions and changes may be made without being limited to the exemplary embodiments described above. Elements of the different embodiments may be combined to form another embodiment.

For example, the multilayer film ML of the substrate W to which the method MT is applied may not have a step shape. Further, the multilayer film ML of the substrate W before the method MT is applied may not have the recess.

In addition, each of the first process gas and the second process gas described above may further contain a halogen element and phosphorus. The halogen element contained in each of the first process gas and the second process gas may be fluorine. Each of the first process gas and the second process gas may contain at least one halogen-containing molecule. Each of the first process gas and the second process gas may contain at least one of fluorocarbon or hydrofluorocarbon as at least the one halogen-containing molecule. The fluorocarbon is, for example, at least one of $CF_4$, $C_3F_8$, $CF_6$, or $CAF_8$. The hydrofluorocarbon is, for example, at least one of $CH_2F_2$, $CHF_3$, or $CH_3F$. The hydrofluorocarbon may contain two or more carbons. The hydrofluorocarbon may contain, for example, three carbons or four carbons.

Each of the first process gas and the second process gas may contain at least one phosphorus-containing molecule as phosphorus described above. The phosphorus-containing molecules may be oxides such as tetraphosphorus decaoxide ($P_4O_{10}$), tetraphosphorus octoxide ($P_4O_8$), and tetraphosphorus hexaoxide ($P_4O_6$). The tetraphosphorus decaoxide is sometimes called diphosphorus pentoxide ($P_2O_6$). The phosphorus-containing molecules may be halides such as phosphorus trifluoride ($PF_3$), phosphorus pentafluoride ($PF_5$), phosphorus trichloride ($PCl_3$), phosphorus pentachloride ($PCl_5$), phosphorus tribromide ($PBr_3$), phosphorus pentabromide ($PBr_5$), and phosphorus iodide ($PI_3$). That is, the molecule containing phosphorus may contain fluorine as the halogen element. Alternatively, the molecule containing phosphorus may contain a halogen element other than fluorine as the halogen element. The phosphorus-containing molecules may be halogenated phosphoryl such as phosphoryl fluoride ($POF_3$), phosphoryl chloride ($POCl_3$), and phosphoryl bromide ($POBr_3$). The phosphorus-containing molecules may be phosphine ($PH_3$), calcium phosphide ($Ca_3P_2$ or the like), phosphoric acid ($H_3PO_4$), sodium phosphate ($Na_3PO_4$), a hexafluorophosphoric acid ($HPF_6$), and the like. The phosphorus-containing molecule may be fluorophosphine ($H_xPF_y$). Here, the sum of x and y is 3 or 5. As the fluorophosphine, $HPF_2$ and $H_2PF_3$ are exemplified. Each of the first process gas and the second process gas may contain one or more phosphorus-containing molecules among the phosphorus-containing molecules described above, as the at least one phosphorus-containing molecule. For example, each of the first process gas and the second process gas may contain at least one of $PF_3$, $PCl_3$, $PF_5$, $PCl_5$, $POCl_3$, $PH_3$, $PBr_3$, and $PBr_5$, as the at least one phosphorus-containing molecule. When each phosphorus-containing molecule contained in each of the first process gas and the second process gas is a liquid or a solid, each phosphorus-containing molecule may be vaporized by heating or the like and be supplied into the chamber 10.

Each of the first process gas and the second process gas may further contain carbon and hydrogen. Each of the first process gas and the second process gas may contain at least one of $H_2$, hydrogen fluoride (HF), hydrocarbon ($C_xH_y$), hydrofluorocarbon ($CH_xF_y$), and $NH_3$, as a molecule containing hydrogen. The hydrocarbon is, for example, $CH_4$ or $C_3H_6$. Here, each of x and y is a natural number. Each of the first process gas and the second process gas may contain fluorocarbon or hydrocarbon (for example, $CH_4$) as the molecules containing carbon. Each of the first process gas and the second process gas may further contain oxygen. The process gases may contain, for example, $O_2$. Alternatively, the process gases may not contain oxygen.

In an embodiment, each of the first process gas and the second process gas may contain a phosphorus-containing gas, a fluorine-containing gas, and a hydrogen-containing gas. The hydrogen-containing gas contains at least one selected from the group consisting of hydrogen fluoride (HF), $H_2$, ammonia ($NH_3$), and hydrocarbon. The phosphorus-containing gas contains at least one of the phosphorus-containing molecules described above. The fluorine-containing gas contains at least one gas selected from the group consisting of a fluorocarbon gas and a carbon-free fluorine-containing gas. The fluorocarbon gas is a gas containing fluorocarbon described above. The carbon-free fluorine-containing gas is, for example, a nitrogen trifluoride gas ($NF_3$ gas) or a sulfur hexafluoride gas ($SF_6$ gas). In addition, each of the first process gas and the second process gas may further contain a hydrofluorocarbon gas. The hydrofluorocarbon gas is a gas of hydrofluorocarbon described above. Further, each of the first process gas and the second process gas may further contain a halogen-containing gas containing a halogen element other than fluorine. The halogen-containing gas is, for example, a $Cl_2$ gas and/or an HBr gas.

In an example, each of the first process gas and the second process gas may contain the phosphorus-containing gas, the fluorocarbon gas, the hydrogen-containing gas, and the oxygen-containing gas (for example, an $O_2$ gas), or may substantially be formed by these gases. In another example, each of the first process gas and the second process gas may contain the phosphorus-containing gas, the carbon-free fluorine-containing gas, the fluorocarbon gas, the hydrogen-containing gas, the hydrofluorocarbon gas, and the halogen-containing gas containing a halogen element other than fluorine, or may be substantially formed by these gases.

In another embodiment, each of the first process gas and the second process gas may contain the phosphorus-containing gas described above, the fluorine-containing gas described above, the hydrofluorocarbon gas described above, and the halogen-containing gas containing a halogen element other than fluorine described above, or may be substantially formed by these gases.

In an embodiment, each of the first process gas and the second process gas may contain a first gas and a second gas. The first gas is a phosphorus-free gas. That is, the first gas is all gases other than the phosphorus-containing gas contained in the process gas. The first gas may contain a halogen element. The first gas may contain the gas of at least one halogen-containing molecule described above. The first gas may further contain carbon and hydrogen. The first gas may further contain the gas of a molecule containing hydrogen and/or a gas of a molecule containing carbon, as described above. The first gas may further contain oxygen. The first gas may contain an $O_2$ gas. Alternatively, the first gas may not contain oxygen. The second gas is a gas containing phosphorus. That is, the second gas is the phosphorus-containing gas described above. The second gas may contain a gas of at least one phosphorus-containing molecule described above.

In each of the first process gas and the second process gas, a flow rate ratio which is the ratio of the flow rate of the second gas to the flow rate of the first gas may be set to be more than 0 and 0.5 or less. The flow rate ratio may be set to 0.075 or more and 0.3 or less. The flow rate ratio may be set to 0.1 or more and 0.25 or less.

In the following, various experiments performed for evaluating the method MT are described. It should be noted that the method MT is not limited by various experiments described below.

First to Third Experiments

In each of first to third experiments, a sample substrate having the same structure as the substrate W illustrated in FIG. 4A and FIG. 4B was prepared. In the sample substrate, each of a plurality of first films F1 was a silicon oxide film, and each of a plurality of second films F2 was a silicon nitride film. In each of the first to third experiments, the multilayer film ML of the sample substrate was etched by using the plasma processing apparatus 1 until the underlying region UR was exposed. In each of the first to third experiments, a gas mixture containing a fluorocarbon gas, an oxygen gas, and an argon gas was used as the first process gas. Further, in each of the first to third experiments, a gas mixture containing a hydrofluorocarbon gas, a fluorocarbon gas, an oxygen gas, and an argon gas was used as the second process gas. In the first experiment, the source radio frequency power HF and the electric bias were continuously supplied in each of Step STb and Step STc. In the second experiment, in each of Step STb and Step STc of the method MT, the pulse HFP and the pulse EBP that were synchronized with each other were supplied as illustrated in FIG. 8. In the second experiment, the pulse frequency, which is the reciprocal of the time length of the pulse cycle PC, was 5 kHz, and the duty ratio was 80%. In the third experiment, the pulse HFP and the pulse EBP were supplied as illustrated in FIG. 9 in each of Step STb and Step STc of the method MT. In the third experiment, the pulse frequency, which is the reciprocal of the time length of the pulse cycle PC, was 2 kHz. Further, in the third experiment, each of the ratio of the time length of the first period P1 in the pulse cycle PC and the ratio of the time length of the third period P3 in the pulse cycle PC, that is, the duty ratio was 70%.

In each of the first to third experiments, the value of the ratio of the width W1 to a total of the width W1 and the width W2 in the sample substrate after the etching was obtained. Before the application of the method MT, the value of the ratio of the width W2 to a total of the width W1 and the width W2 in the sample substrate was about 0.5. The values of the ratios after the application of the method MT in the first to third experiments were 0.32, 0.46, and 0.43, respectively. Therefore, it was confirmed that, by supplying the pulse HFP and the pulse EBP in each of Steps STb and STc, the change in the value of the ratio of the width W2 to a total of the width W1 and the width W2 in the sample substrate after etching is reduced as compared with the value of the ratio of the width W2 to a total of the width W1 and the width W2 before the etching. Therefore, according to the method MT, it was confirmed that, even when the depth of the recess was increased by etching the multilayer film ML, the expansion of the width of the recess was suppressed.

Here, the various exemplary embodiments included in the present disclosure are described in [E1] to [E16] below.

[E1] An etching method comprising:

(a) preparing a substrate on a substrate support in a chamber of a plasma processing apparatus, the substrate including a multilayer film and a mask disposed on the multilayer film, the multilayer film including a plurality of first films formed of silicon oxide and a plurality of second films that are formed of silicon nitride and alternately stacked with the plurality of first films, the multilayer film including a first region and a second region below an opening of the mask, the second region being adjacent to the first region, each of the first region and the second region having a step shape in a cross-section perpendicular to a direction in which the first region and the second region are arranged, and a depth of a first recess defined by the first region below the opening of the mask is deeper than a depth of a second recess defined by the second region below the opening of the mask;

(b) etching one or more first films among the plurality of first films by generating plasma from a first process gas in the chamber; and (c) etching one or more second films among the plurality of second films by generating plasma from a second process gas in the chamber, wherein, in each of (b) and (c), a pulse of a source radio frequency power for generating plasma in the chamber and a pulse of an electric bias for attracting ions from the plasma in the chamber to the substrate are intermittently or periodically supplied.

[E2] The etching method according to E1, wherein the pulse of the source radio frequency power and the pulse of the electric bias are in synchronization with each other and are simultaneously supplied.

[E3] The etching method according to E1, wherein a period in which (b) is performed includes a first period and a second period that is alternated with the first period, a period in which (c) is performed includes a third period and a fourth period that is alternated with the third period, the pulse of the source radio frequency power for generating the plasma in the chamber is supplied in each of the first period and the third period, and the pulse of the electric bias for attracting the ions from the plasma in the chamber into the substrate is supplied in each of the second period and the fourth period.

[E4] The etching method according to E3, wherein a power level of the source radio frequency power in the second period is lower than a power level of the source radio frequency power in the first period, and a power level of the source radio frequency power in the fourth period is lower than a power level of the source radio frequency power in the third period.

[E5] The etching method according to E3 or E4, wherein the electric bias has a level in the first period, which is lower than a level of the electric bias in the second period, or is stopped in the first period, and the electric bias has a level in the third period, which is lower than a level of the electric bias in the fourth period, or is stopped in the third period.

[E6] The etching method according to any one of E3 to E5, wherein each of a ratio of a time length of the first period to a total of the time length of the first period and a time length of the second period and a ratio of a time length of the third period to a total of the time length of the third period and a time length of the fourth period is 65% or more.

[E7] The etching method according to any one of E1 to E6, wherein the first process gas contains a fluorocarbon gas, and the second process gas contains a hydrofluorocarbon gas.

[E8] The etching method according to any one of E1 to E7, wherein (b) and (c) are alternately repeated.

[E9] An etching method comprising:

(a) preparing a substrate on a substrate support in a chamber of a plasma processing apparatus, the substrate including a multilayer film including a plurality of first films and a plurality of second films that are formed of a material different from a material of the plurality of first films and are alternately stacked with the plurality of first films;

(b) repeating a first cycle including (b1) forming a first deposit on one or more first films among the plurality of first films in a first period, the first deposit being supplied from plasma generated from a first process gas in the chamber, and (b2) etching the one or more first films by using the plasma generated from the first process gas in the chamber in a second period; and (c) repeating a second cycle including (c1) forming a second deposit on one or more second films among the plurality of second films in a third period, the second deposit being supplied from plasma generated from a second process gas in the chamber, and (c2) etching the one or more second films by using the plasma generated from the second process gas in the chamber in a fourth period, in which a third deposit formed on the substrate in (b2) is etched together with the one or more second films.

[E10] The etching method according to E9, wherein a pulse of a source radio frequency power for generating plasma in the chamber is supplied in each of the first period and the third period, and a pulse of an electric bias for attracting ions from the plasma in the chamber into the substrate is supplied in each of the second period and the fourth period.

[E11] The etching method according to E10, wherein a power level of the source radio frequency power in the second period is lower than a power level of the source radio frequency power in the first period, and a power level of the source radio frequency power in the fourth period is lower than a power level of the source radio frequency power in the third period.

[E12] The etching method according to E10 or E11, wherein the electric bias has a level in the first period, which is lower than a level of the electric bias in the second period, or is stopped in the first period, and the electric bias has a level in the third period, which is lower than a level of the electric bias in the fourth period, or is stopped in the third period.

[E13] The etching method according to any one of E10 to E12, wherein each of a ratio of a time length of the first period to a total of the time length of the first period and a time length of the second period and a ratio of a time length of the third period to a total of the time length of the third period and a time length of the fourth period is 65% or more.

[E14] The etching method according to any one of E9 to E13, wherein each of the plurality of first films is formed of silicon oxide, each of the plurality of second films is formed of silicon nitride, the first process gas contains a fluorocarbon gas, and the second process gas contains a hydrofluorocarbon gas.

[E15] The etching method according to any one of E9 to E14, wherein (b) and (c) are alternately repeated.

[E16] A plasma processing apparatus comprising:

a chamber;

a substrate support disposed in the chamber;

a plasma generator configured to generate plasma from a gas in the chamber;

a bias power source electrically coupled to the substrate support; and a controller configured to control the plasma generator and the bias power source, wherein the controller is configured to perform, in a state where a substrate including a multilayer film including a plurality of first films and a plurality of second films that are formed of a material different from a material of the plurality of first films and are alternately stacked with the plurality of first films is placed on the substrate support, (b) repeating a first cycle including (b1) forming a first deposit on one or more first films among the plurality of first films in a first period, the first deposit being supplied from plasma generated from a first process gas in the chamber, and (b2) etching the one or more first films by using the plasma generated from the first process gas in a second period, and (c) repeating a second cycle including (c1) forming a second deposit on one or more second films among the plurality of second films in a third period, the second deposit being supplied from plasma generated from a second process gas in the chamber, and (c2) etching the one or more second films by using the plasma generated from the second process gas in a fourth period, in which a third deposit formed on the substrate in (b2) is etched together with the one or more second films.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising: (a) preparing a substrate on a substrate support in a chamber of a plasma processing apparatus, the substrate including a multilayer film and a mask disposed on the multilayer film, the multilayer film including a plurality of first films formed of silicon oxide and a plurality of second films that are formed of silicon nitride and alternately stacked with the plurality of first films, the multilayer film including a first region and a second region below an opening of the mask, the second region being adjacent to the first region in a first direction of a first cross-section, the first direction being parallel to a top surface of the multilayer film, each of the first region and the second region having a step shape in a second direction of a second cross-section perpendicular to the first direction of the first cross-section in which the first region and the second region are arranged, and a depth of a first recess defined by the first region below the opening of the mask is deeper than a depth of a second recess defined by the second region below the opening of the mask;

(b) etching one or more first films among the plurality of first films by generating plasma from a first process gas in the chamber; and (c) etching one or more second films among the plurality of second films by generating plasma from a second process gas in the chamber, wherein, in each of said (b) and said (c), a pulse of a source radio frequency power for generating plasma in the chamber and a pulse of an electric bias for attracting ions from the plasma in the chamber to the substrate are intermittently or periodically supplied.

2. The etching method according to claim 1, wherein the pulse of the source radio frequency power and the pulse of the electric bias are in synchronization with each other and are simultaneously supplied.

3. The etching method according to claim 1, wherein a period in which said (b) is performed includes a first period and a second period that is alternated with the first period, a period in which said (c) is performed includes a third period and a fourth period that is alternated with the third period, the pulse of the source radio frequency power for generating the plasma in the chamber is supplied in each of the first period and the third period, and the pulse of the electric bias for attracting the ions from the plasma in the chamber into the substrate is supplied in each of the second period and the fourth period.

4. The etching method according to claim 3, wherein a power level of the source radio frequency power in the second period is lower than a power level of the source radio frequency power in the first period, and a power level of the source radio frequency power in the fourth period is lower than a power level of the source radio frequency power in the third period.

5. The etching method according to claim 4, wherein the electric bias has a level in the first period, which is lower than a level of the electric bias in the second period, or is stopped in the first period, and the electric bias has a level in the third period, which is lower than a level of the electric bias in the fourth period, or is stopped in the third period.

6. The etching method according to claim 3, wherein each of a ratio of a time length of the first period to a total of the time length of the first period and a time length of the second period and a ratio of a time length of the third period to a total of the time length of the third period and a time length of the fourth period is 65% or more.

7. The etching method according to claim 1, wherein the first process gas contains a fluorocarbon gas, and the second process gas contains a hydrofluorocarbon gas.

8. The etching method according to claim 1, wherein said (b) and said (c) are alternately repeated.

9. An etching method comprising:

(a) preparing a substrate on a substrate support in a chamber of a plasma processing apparatus, the substrate including a multilayer film including a plurality of first films and a plurality of second films that are formed of a material different from a material of the plurality of first films and are alternately stacked with the plurality of first films;

(b) repeating a first cycle including (b1) forming a first deposit on one or more first films among the plurality of first films in a first period, the first deposit being supplied from plasma generated from a first process gas in the chamber, and (b2) etching the one or more first films by using the plasma generated from the first process gas in the chamber in a second period; and (c) repeating a second cycle including (c1) forming a second deposit on one or more second films among the plurality of second films in a third period, the second deposit being supplied from plasma generated from a second process gas in the chamber, and (c2) etching the one or more second films by using the plasma generated from the second process gas in the chamber in a fourth period, in which a third deposit formed on the substrate in said (b2) is etched together with the one or more second films.

10. The etching method according to claim 9, wherein a pulse of a source radio frequency power for generating plasma in the chamber is supplied in each of the first period and the third period, and a pulse of an electric bias for attracting ions from the plasma in the chamber into the substrate is supplied in each of the second period and the fourth period.

11. The etching method according to claim 10, wherein a power level of the source radio frequency power in the second period is lower than a power level of the source radio frequency power in the first period, and a power level of the source radio frequency power in the fourth period is lower than a power level of the source radio frequency power in the third period.

12. The etching method according to claim 11, wherein the electric bias has a level in the first period, which is lower than a level of the electric bias in the second period, or is stopped in the first period, and the electric bias has a level in the third period, which is lower than a level of the electric bias in the fourth period, or is stopped in the third period.

13. The etching method according to claim 10, wherein each of a ratio of a time length of the first period to a total of the time length of the first period and a time length of the second period and a ratio of a time length of the third period to a total of the time length of the third period and a time length of the fourth period is 65% or more.

14. The etching method according to claim 9, wherein each of the plurality of first films is formed of silicon oxide, each of the plurality of second films is formed of silicon nitride, the first process gas contains a fluorocarbon gas, and the second process gas contains a hydrofluorocarbon gas.

15. The etching method according to claim 9, wherein said (b) and said (c) are alternately repeated.

* * * * *